United States Patent
Byeon et al.

(10) Patent No.: US 8,779,797 B2
(45) Date of Patent: Jul. 15, 2014

(54) SEMICONDUCTOR APPARATUS

(75) Inventors: Sang Jin Byeon, Icheon-si (KR); Jae Jin Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 184 days.

(21) Appl. No.: 13/544,548

(22) Filed: Jul. 9, 2012

(65) Prior Publication Data

US 2012/0273783 A1 Nov. 1, 2012

Related U.S. Application Data

(62) Division of application No. 12/836,546, filed on Jul. 14, 2010, now abandoned.

(30) Foreign Application Priority Data

Jan. 29, 2010 (KR) .......................... 10-2010-0008635

(51) Int. Cl.
H03K 19/173 (2006.01)

(52) U.S. Cl.
USPC .............................. 326/37; 365/193; 365/194

(58) Field of Classification Search
USPC ................... 326/27–34, 37–41, 93, 101–103
See application file for complete search history.

(56) References Cited

U.S. PATENT DOCUMENTS

| 7,466,577 B2 * | 12/2008 | Sekiguchi et al. ............. 365/51 |
| 7,746,711 B2 * | 6/2010 | Inaba ............................ 365/193 |
| 2009/0237970 A1 * | 9/2009 | Chung ............................ 365/51 |

* cited by examiner

*Primary Examiner* — Jany Richardson

(74) *Attorney, Agent, or Firm* — William Park & Associates Patent Ltd.

(57) ABSTRACT

A semiconductor apparatus has a plurality of chips stacked therein, and generation timing of read control signals for controlling read operations of the plurality of stacked chips is controlled such that times after a read command is applied to when data are outputted from respective chips are made to substantially correspond to one another.

12 Claims, 4 Drawing Sheets

20,40

SEMICONDUCTOR APPARATUS

CROSS-REFERENCES TO RELATED APPLICATION

The present application claims priority under 35 U.S.C. §119(a) to Korean Patent Application No. 10-2010-0008635, filed on Jan. 29, 2010, in the Korean Intellectual Property Office, which is incorporated herein by reference in its entirety as if set forth in full.

BACKGROUND

1. Technical Field

Various exemplary aspects of the present invention relate to a semiconductor apparatus. In particular, certain exemplary aspects relate to a three-dimensional semiconductor apparatus.

2. Related Art

In order to increase the degree of integration of a semiconductor apparatus, a 3D (three-dimensional) semiconductor apparatus has been developed. The 3-D semiconductor apparatus includes a plurality of chips stacked for placement in a single package. The resultant structure is then packaged. The 3D semiconductor apparatus may achieve a maximum degree of integration in the same space by vertically stacking two or more chips.

The 3D semiconductor apparatus may be realized in a variety of ways. For example, when a plurality of structurally similar chips are stacked and are connected to each other with metal wires, they can operate as a single semiconductor apparatus.

Recently, a TSV (through-silicon via) semiconductor apparatus has been disclosed in which silicon vias pass through a plurality of stacked chips so that all the chips are connected to each other. Since the through-silicon vias pass through the respective chips vertically in the TSV type semiconductor apparatus, the package size is much smaller compared to the semiconductor apparatus in which respective chips are connected through the wires.

In general, the TSV type semiconductor apparatus may be composed of a master chip and a plurality of slave chips which are connected to the master chip through TSVs. For example, in a memory apparatus, the master chip includes all logic circuits in a peripheral circuit region for the operation of the memory apparatus. The slave chips include memory cores in which data may be stored and circuits for the operation of the memory cores, so as to operate as a single semiconductor apparatus.

When a plurality of chips are stacked in the 3D semiconductor apparatus, they share data input and output since they operate as a single semiconductor apparatus. In a semiconductor apparatus containing wired connections, the data outputted from respective stacked chips may be transferred to a controller through input/output lines. In a semiconductor apparatus containing TSV connections, the slave chip data may be transmitted to the master chip and may be outputted through pads located on the master chip. In order to improve the operational speed of the semiconductor apparatus, the output timing of the data transmitted from the stacked chips need to substantially coincide.

Because the stacked chips have different characteristics due to variations in PVT (process, voltage and temperature), however, they can hardly show the same performance characteristics. More specifically, the respective chips have skews due to their different PVT properties. Thus, a skew may result from the difference in data output timing between a chip with a high operational speed and one with a low operational speed. Consequently, the operational speed of the semiconductor apparatus may be lowered when trying to secure a valid data window with the existence of the skew.

SUMMARY

Accordingly, various exemplary aspects of the invention may provide semiconductor apparatuses and/or methods that may improve the economic efficiency and thereby price competitiveness of a semiconductor apparatus. In particular, a semiconductor apparatus capable of correcting skews of a plurality of stacked chips constituting a single semiconductor apparatus is described herein.

In one exemplary aspect of the present invention, a semiconductor apparatus has a plurality of chips stacked therein, wherein generation timing of read control signals for controlling read operations of the plurality of stacked chips are controlled such that the time from the application of a read command to data output from respective chips are made to be substantially the same.

In another exemplary aspect of the present invention, a semiconductor apparatus has a plurality of chips stacked therein, wherein data output timing of the plurality of stacked chips are controlled such that the time from the application of a read command to data output from respective chips are made to be substantially the same.

In still another exemplary aspect of the present invention, a semiconductor apparatus having first and second chips stacked therein comprises a first calibration unit provided in the first chip and configured to receive read control signals of the first chip, delay the read control signals of the first chip and output delayed read control signals; and a second calibration unit provided in the second chip and configured to receive read control signals of the second chip, delay the read control signals of the second chip and output delayed read control signals.

In still another exemplary aspect of the present invention, a semiconductor apparatus having first and second chips stacked therein comprises a first data calibration unit provided in the first chip and configured to receive first chip data outputted from the first chip, delay the first chip data and output delayed first chip data; and a second data calibration unit provided in the second chip and configured to receive second chip data outputted from the second chip, delay the second chip data and output delayed second chip data.

In still another exemplary aspect of the present invention, a semiconductor apparatus having first and second chips stacked therein comprises a first calibration unit provided in the first chip and configured to delay and output read control signals of the first chip; a first data calibration unit provided in the first chip and configured to delay and output data outputted from the first chip; a second calibration unit provided in the second chip and configured to delay and output read control signals of the second chip; and a second data calibration unit provided in the second chip and configured to delay and output data outputted from the second chip.

In still another exemplary aspect of the present invention, a semiconductor apparatus having a master chip and a slave chip stacked therein comprises a first calibration unit provided in the master chip and configured to receive a pipe latch control signal and delay and output the pipe latch control signal; and a second calibration unit provided in the slave chip and configured to receive a column selection signal and an output strobe signal and delay and output the column selection signal and the output strobe signal.

BRIEF DESCRIPTION OF THE DRAWINGS

Reference will now be made in detail to the exemplary embodiments consistent with the present disclosure, examples of which are illustrated with reference to the accompanying drawings. Wherever possible, the same reference characters will be used throughout the drawings to refer to the same or like parts.

DETAILED DESCRIPTION

Figure 1:
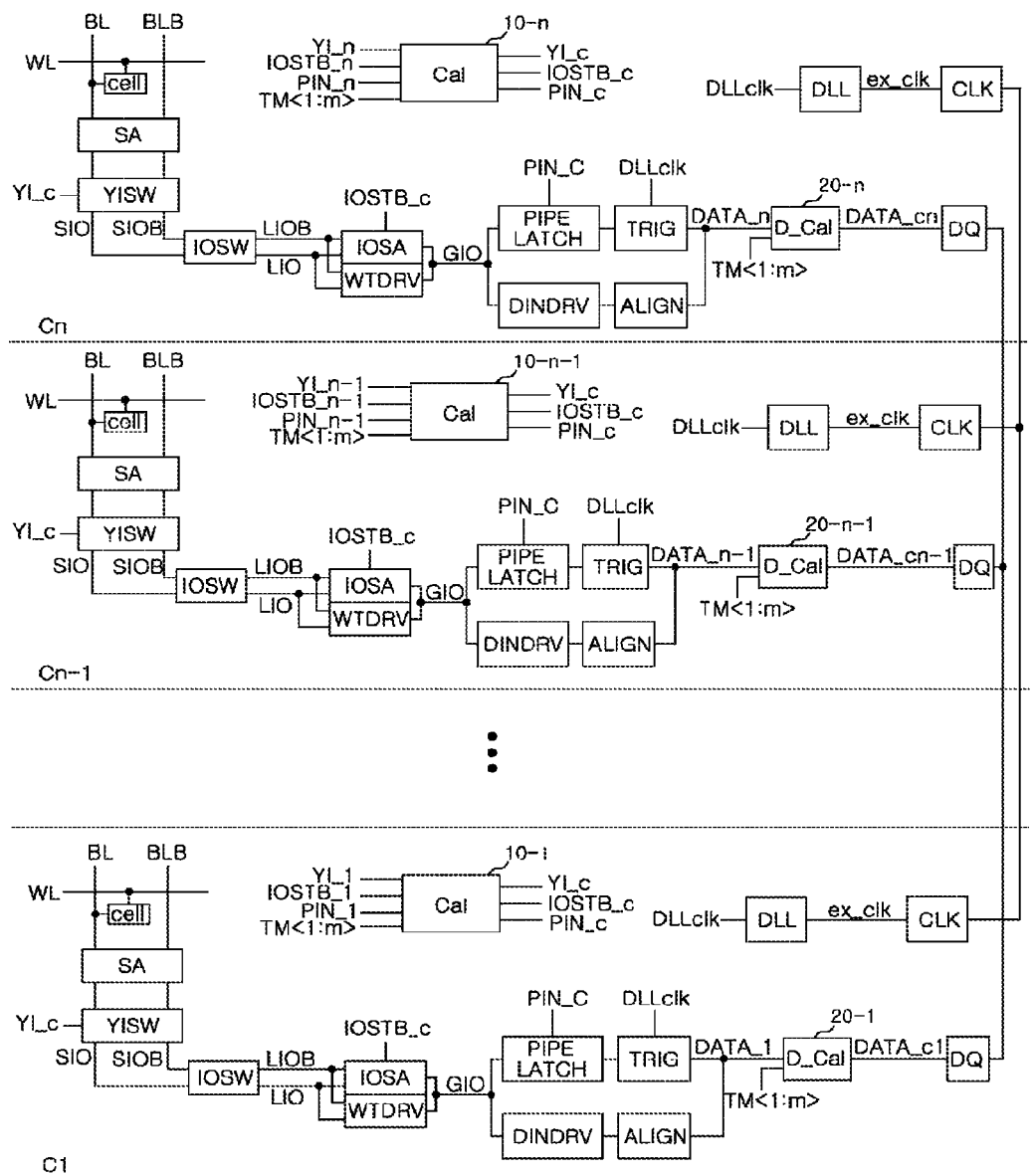
FIG. 1 is a schematic diagram illustrating an exemplary configuration of a semiconductor apparatus consistent with the present disclosure.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 schematically illustrates an exemplary configuration of a semiconductor apparatus consistent with various exemplary aspects of the invention. Referring to FIG. 1, a semiconductor apparatus 1 is configured as a 3D semiconductor apparatus in which a plurality of structurally similar chips are stacked. The semiconductor apparatus 1 includes first to nth chips C1-Cn. The first to nth chips C1-Cn may operate as a single semiconductor apparatus because the data pads DQ thereof are connected through wires such as metal wires. An external clock ex_clk is inputted through clock pads CLK which are provided in the respective chips through wires.

In FIG. 1, the first to nth chips C1-Cn constituting the semiconductor apparatus 1 have the same structure. Describing representatively the configuration of the nth chip Cn, the nth chip Cn includes bit lines BL and BLB as data transmission paths, segment input/output lines SIO and SIOB, local input/output lines LIO and LIOB, and a global input/output line GIO. The nth chip Cn further includes a sense amplifier SA, a column switch YISW, an input/output switch IOSW, a read driver IOSA, a pipe latch PIPE LATCH, and a trigger unit TRIG. The nth chip Cn further includes a write driver WTDRV, an input driver DINDRV, a data alignment unit ALIGN, and a DLL (delay locked loop) circuit DLL.

The sense amplifier SA amplifies the data of a memory cell 'cell' which is loaded on the bit lines BL and BLB. In response to a calibrated column selection signal YI_c, the column switch YISW connects the bit lines BL and BLB to the segment input/output lines SIO and SIOB. The input/output switch IOSW connects the segment input/output lines SIO and SIOB to the local input/output lines LIO and LIOB. In response to a calibrated output strobe signal IOSTB_c, the read driver IOSA amplifies the data transmitted through the local input/output lines LIO and LIOB and outputs the amplified data to the global input/output line GIO. In response to a calibrated pipe latch control signal PIN_c, the pipe latch PIPE LATCH stores the data transmitted through the global input/output line GIO. The trigger unit TRIG receives a DLL clock DLLclk transmitted from the DLL circuit DLL and sequentially outputs the data DATA_n stored in the pipe latch PIPE LATCH to the data pad DQ. Therefore, the read driver IOSA, the pipe latch PIPE LATCH and the trigger unit TRIG are circuits which are associated with the read operation of the nth chip Cn. A column selection signal YI, an output strobe signal IOSTB and a pipe latch control signal PIN are internally generated when a read command is inputted to the semiconductor apparatus 1, and serve as read control signals that may control the read operation of the nth chip Cn.

The data alignment unit ALIGN aligns the data inputted through the data pad DQ in parallel, and the input driver DINDRV outputs the aligned data to the global input/output line GIO. The write driver WTDRV amplifies the data transmitted through the global input/output line GIO and outputs the amplified data to the local input/output lines LIO and LIOB. Accordingly, the data alignment unit ALIGN, the input driver DINDRV and the write driver WTDRV are part of the write operation of the nth chip Cn.

The read operation of the nth chip Cn will be described in detail below. When the read command is applied from an outside of the semiconductor apparatus 1, it generates the column selection signal YI_n, the output strobe signal IOSTB_n and the pipe latch control signal PIN_n. While not shown in any figure, the column selection signal YI_n, the output strobe signal IOSTB_n and the pipe latch control signal PIN_n are generated through a buffer circuit and a delay circuit provided in the nth chip Cn when the read command is applied. If a word line WL is activated for the read operation, the memory cell 'cell' loads its data on the bit lines BL and BLB. The sense amplifier SA then amplifies the data. If the column selection signal YI_n is enabled, the data amplified by the sense amplifier SA is transmitted to the segment input/output lines SIO and SIOB. If the output strobe signal IOSTB_n is then enabled, the data transmitted through the segment input/output lines SIO and SIOB is amplified by the read driver IOSA. The amplified data is then outputted to the global input/output line GIO. In response to the pipe latch control signal PIN_n, the data transmitted through the global input/output line GIO is stored in the pipe latch PIPE LATCH, and is outputted to the data pad DQ. The data pat DQ syncs the data with the edge of the DLL clock DLLclk. The read operation of the nth chip Cn is then completed. The first to n-1$^{st}$ chips C1-Cn-1 have the same configuration as the nth chip Cn, and the read operations thereof are performed in the same manner as the nth chip Cn.

Since column selection signals YI_1 through YI_n, output strobe signals IOSTB_1 through IOSTB_n, and pipe latch control signals PIN_1 through PIN_n, or the read control signals of the first to nth chips C1-Cn, are generated through various logic circuits when the read command is applied, the generation timing of those signals may vary depending upon the PVT properties of the first to nth chips C1-Cn. Varying the generation timing of the read control signals may be a factor in inducing skews in the first to nth chips C1-Cn. Therefore, the first to nth chips C1-Cn of the semiconductor apparatus 1 according to exemplary aspect of the present invention include calibration units 10-1 to 10-n, respectively. The calibration units 10-1 to 10-n, respectively provided in the first to nth chips C1-Cn, delay the read control signals of the respective chips and output the calibrated read control signals YI_c, IOSTB_c and PIN_c.

Hence, in response to the calibrated column selection signal YI_c, the column switch YISW transmits the data amplified by the sense amplifier SA to the segment input/output lines SIO and SIOB in the nth chip Cn, Then, in response to the calibrated output strobe signal IOSTB_c, the read driver IOSA transmits the data received through the segment input/output lines SIO and SIOB to the global input/output line GIO. Finally, in response to the calibrated pipe latch control signal PIN_c, the pipe latch PIPE LATCH stores and outputs the data received through the global input/output line GIO.

The calibration units 10-1 to 10-n may change the delay amounts of the read control signals in response to test mode signals TM<1:m>. Because the calibration units 10-1 to 10-n may control the delay amounts in response to the test mode signals TM<1:m>, it is possible to make the generation timing of the read control signals of the first to nth chips C1-Cn match. For example, when the generation of read control signals from the nth chip Cn is first, the generation of the read control signals of the n-$1^{st}$ chip Cn-1 is second, and the generation of the read control signals from the first chip C1 is last, the read control signals of the nth chip Cn may be delayed most by the calibration unit 10-n, the read control signals of the n-$1^{st}$ chip Cn-1 may be delayed second most by the calibration unit 10-n-1, and the read control signals of the first chip C1 may remain untouched. Using this process, the second to nth chips C2-Cn may be configured to match the generation timing of the read control signals of the first chip C1.

The calibrated read control signals of the first to nth chips C1-Cn, including the calibrated column selection signal YI_c, the calibrated output strobe signal IOSTB_c and the calibrated pipe latch control signal PIN_c may be inputted at the same timing to circuit components provided in each chip, respectively. These chips are associated with the read operation, i.e., the column switch YISW, the read driver IOSA and the pipe latch PIPE LATCH. As a result, the read command may be applied and data may be stored in the respective chips are outputted to the data pads DQ simultaneously. Therefore, all the skews of the first to nth chips C1-Cn may be corrected by the provision of the calibration units 10-1 to 10-n.

In FIG. 1, the semiconductor apparatus 1 may include data calibration units 20-1 through 20-n, which are provided as alternatives to or extensions of the calibration units 10-1 to 10-n. The data calibration units 20-1 through 20-n may be disposed in the first to nth chips C1-Cn, respectively. The data calibration units 20-1 through 20-n are configured to delay the data DATA_1 through DATA_n outputted from the first to nth chips C1-Cn and output delayed data DATA_c1 through DATA_cn. The data calibration units 20-1 through 20-n may change DATA_1 through DATA_n delay amount in response to the test mode signals TM<1:m>.

The data calibration units 20-1 through 20-n may be alternatives to the calibration units 10-1 to 10-n. When the read control signals of the first to nth chips C1-Cn are not generated in sync and the data is not outputted in sync, the first to nth chips C1-Cn data output times may be synced. For example, if the data DATA_n of the nth chip Cn is outputted first, the data DATA_n-1 of the n-$1^{st}$ chip Cn-1 is outputted second and the data DATA_1 of the first chip C1 is outputted last. However, the data calibration unit 20-n may output the data DATA_cn by delaying data DATA_n outputted from the nth chip Cn most. Similarly, the data calibration unit 20-n-1 may output the data DATA_cn-1 by delaying data DATA_n-1 outputted from the n-$1^{st}$ chip Cn-1 second most, and the data calibration unit 20-1 may output the data DATA_c1 by not delaying the data DATA_1 outputted from the first chip C1. In this way, the data output times of the first to nth chips C1-Cn may match the data output times of the first chip C1.

Even if both of the calibration units 10-1 to 10-n and data calibration units 20-1 through 20-n are provided, the data output times from the first to nth chips C1-Cn may be configured to match each other.

Figure 2:
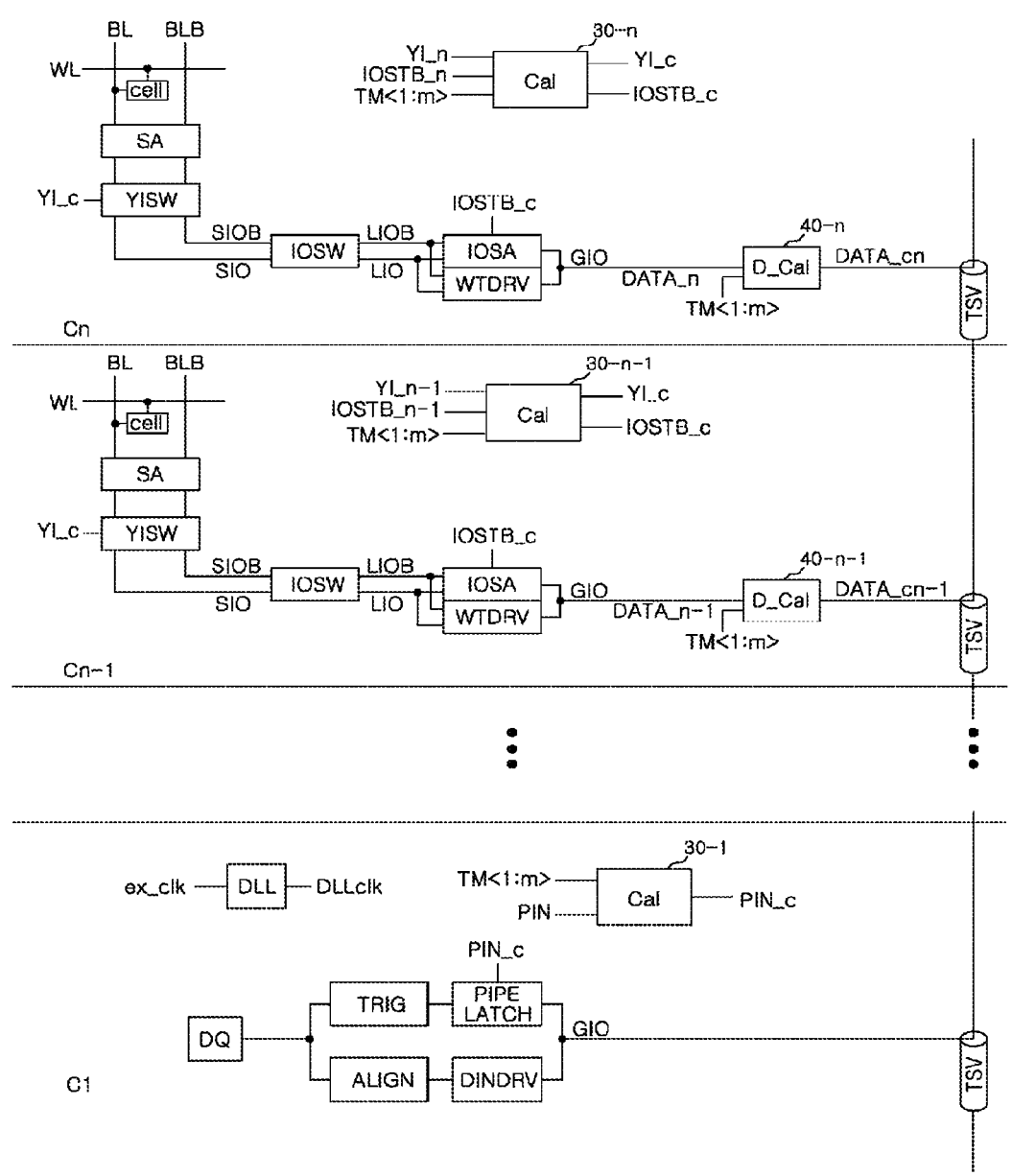
FIG. 2 is a schematic diagram illustrating another exemplary configuration of a semiconductor apparatus consistent with the present disclosure.

FIG. 2 is a diagram schematically illustrating the configuration of a semiconductor apparatus according to another exemplary aspect of the present invention. In FIG. 2, a semiconductor apparatus 2 includes first to nth chips C1-Cn. The first to nth chips C1-Cn are stacked and constitute a single semiconductor apparatus. The first to nth chips C1-Cn are connected by TSVs (through-silicon vias). When the semiconductor apparatus which uses the TSVs, each chip does not need to have data pads, since the data outputted from the respective chips is transmitted through the TSVs. Only one chip in the stack of chips must have a data pad. This chip serves as a master chip for communicating with a controller. The other chips excluding the master chip serve as slave chips. Thus, the master chip is normally provided with a pipe latch PIPE LATCH, a trigger unit TRIG, a data alignment unit ALIGN and an input driver DINDRV. These pads perform data input/output operations that allow the master chip to communicate with the controller. Each slave chip and/or the master chip is provided with a read driver IOSA and a write driver WTDRV to perform a core operation. Pads for receiving an external clock ex_clk are also provided to the master chip only.

In FIG. 2, the first chip C1 operates as the master chip and the second through nth chip C2-Cn operate as the slave chips. The read operation of the semiconductor apparatus 2 will be described below.

If a read command is externally applied, the first chip C1 as the master chip receives the read command, generates an internal read command from the external read command, and transfers the internal read command to the second to nth chips C2-Cn as the slave chips. Accordingly, the respective slave chips generate read control signals from the internal read command. Alternatively, the read control signals may be generated by the master chip and transmitted to the respective slave chips. While the read control signals may include a column selection signal YI, an output strobe signal IOSTB and a pipe latch control signal PIN, the read control signals of the slave chips may include column selection signals YI_2 through YI_n and output strobe signals IOSTB_2 through IOSTB_n. The read control signal of the master chip may include the pipe latch control signal PIN.

The second to nth chips C2 to Cn output the data stored in the second to nth chips C2-Cn in response to the read control signals generated from the received internal read command. The operation of the nth chip Cn will be described to explain the output path. In Cn, the data stored in a memory cell 'cell' of the nth chip Cn is loaded on bit lines BL and BLB while a word line WL is activated. A sense amplifier SA amplifies the data, which is loaded on the bit lines BL and BLB. A column switch YISW connects the bit lines BL and BLB with segment input/output lines SIO and SIOB in response to a calibrated column selection signal YI_c. The data loaded on the bit lines BL and BLB is transmitted to the segment input/output lines SIO and SIOB. The input/output switch IOSW connects the segment input/output lines SIO and SIOB to local input/output lines LIO and LIOB. The read driver IOSA amplifies the data transmitted through the local input/output lines LIO and LIOB in response to a calibrated output strobe signal IOSTB_c, and outputs the amplified data to a global input/output line GIO. Data DATA_n transmitted to the global input/output line GIO is transmitted to the first chip C1 through the TSV.

The pipe latch PIPE LATCH provided in the first chip C1 receives and stores the data DATA_n of the nth chip Cn which is transmitted through the TSV, in response to a calibrated pipe latch control signal PIN_c. It receives a DLL clock DLLclk, which is generated by a DLL circuit DLL and outputs the DLL clock DLLclk to the data pad DQ, completing the read operation of semiconductor apparatus 2.

The second to n-1st chips C2-Cn-1 as the slave chips have the same configuration as the nth chip Cn and perform the read operation in the same manner as the nth chip Cn.

Like the semiconductor apparatus 1 according to the aforementioned exemplary aspect of the present invention, the read control signals are generated through a number of logic circuits after the read command is applied. In this case, the generation timing of the read control signals may not help because they vary depending upon the PVT properties of the respective chips. Even though the read control signals are generated in the master chip, the read control signals are transmitted at different times from the master chip to the slave chips. As a result, skews occur in the first to nth chips C1-Cn. When the skews are substantial, the operational speed of the entire semiconductor apparatus consequently decreases to secure a valid data window.

Accordingly, the first to nth chips C1-Cn include calibration units 30-1 to 30-n. The calibration units 30-1 to 30-n are provided in the respective chips. They delay the read control signals of the respective chips and output calibrated read control signals. The calibration unit 30-1 provided in the first chip C1, as the master chip, delays the pipe latch control signal PIN among the read control signals and generates a calibrated pipe latch control signal PIN_c. The calibration units 30-2 through 30-n provided in the second to nth chips C2-Cn, the slave chips, delay the column selection signals YI_2 through YI_n and the output strobe signals IOSTB_2 through IOSTB_n. They may also generate the calibrated column selection signal YI_c and the calibrated output strobe signal IOSTB_c.

The calibration units 30-1 to 30-n may change the delay amounts of the read control signals in response to test mode signals TM<1:m>. For example, when the read control signals of the nth chip Cn are generated first, the read control signals of the n-1$^{st}$ chip Cn-1 are generated second and the read control signals of the second chip C2 are generated last. Accordingly, the read control signals of the nth chip Cn are delayed most on output by the calibration unit 30-n. The read control signals of the n-1$^{st}$ chip Cn-1 may be outputted by being delayed second most by the calibration unit 30-n-1, and the read control signals of the second chip C2 may be outputted by not being delayed by the calibration unit 30-2. Accordingly, the read control signals of the third through nth chips C3 through Cn may be generated at the same time read control signals of the second chip C2 are generated. As a result, the read control signals of the second to nth chips C2-Cn may be inputted with the circuit components associated with the read operation. Since the column switch YISW and the read driver IOSA measure the delay at which the read command is applied, the data stored in the second to nth chips C2-Cn are transmitted to the TSVs at the same time.

The second to nth chips C2 though Cn of the semiconductor apparatus 2 may include data calibration units 40-2 through 40-n. they are provided as alternatives to or enhancements of the calibration units 30-2 through 30-n. The data calibration units 40-2 to 40-n may be disposed in the second to nth chips C2-Cn, respectively. The data calibration units 40-2 through 40-n are configured to delay the data DATA_2 to DATA_n, which is outputted from the read drivers IOSA of the respective chips, and output delayed data DATA_c2 through DATA_cn to the TSVs. The data calibration units 40-2 through 40-n may change the delay amounts of the data DATA_2 through DATA_n in response to the test mode signals TM<1:m>. For example, the data DATA_n of the nth chip Cn is transmitted first to the TSV, the data DATA_n-1 of the n-1$^{st}$ chip Cn-1 is transmitted second to the TSV and the data DATA_2 of the second chip C2 is transmitted last to the TSV. In response, the data calibration unit 40-n may output the data DATA_cn by delaying the data DATA_n outputted from the nth chip Cn most; the data calibration unit 40-n-1 may output the data DATA_cn-1 by delaying the data DATA_n-1 outputted from the n-1$^{st}$ chip Cn-1 second most, and the data calibration unit 40-2 may output the data DATA_c2 by not delaying the data DATA_2 outputted from the second chip C2. Consequently, with respect to the read command application, the data output of the second to nth chips C2-Cn may and the data output of the second chip C2 is simultaneous.

If the calibration units 30-2 through 30-n and the data calibration units 40-2 through 40-n are provided together, they simultaneously transmit data stored in the second to nth chips C2-Cn to the TSVs. Thus, because the first chip C1 and the second to nth chips C2-Cn receive data simultaneously with respect to the read command, the data may be stably outputted even when the semiconductor apparatus operates at a high speed.

Figure 3:
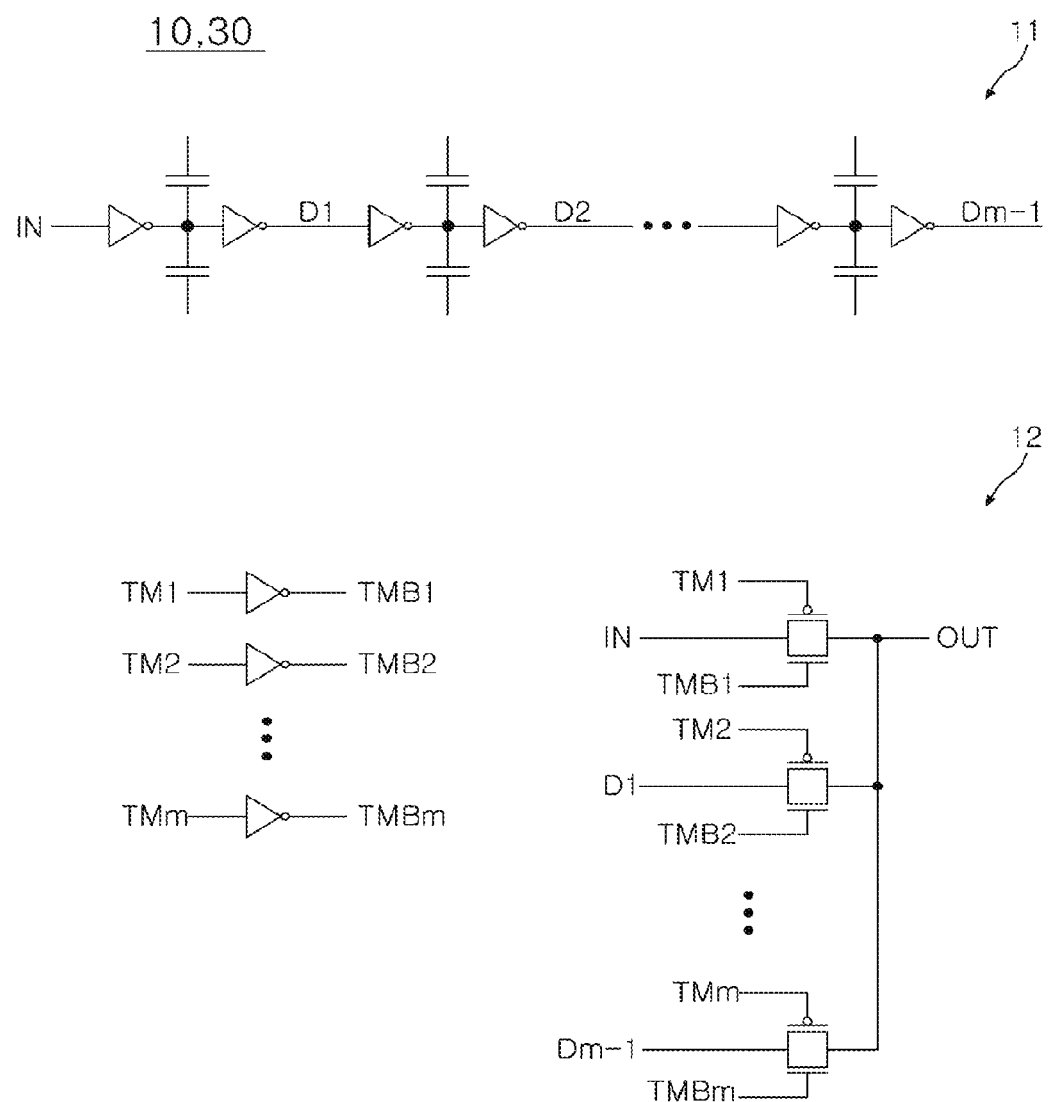
FIG. 3 is a circuit diagram illustrating an exemplary aspect of calibration units shown in FIGS. 1 and 2.

FIG. 3 is a circuit diagram illustrating an exemplary aspect of calibration units shown in FIGS. 1 and 2. In FIG. 3, each of the calibration unit 10 and 30 may include a delay line 11 and a select section 12. The delay line 11 includes a plurality of unit delay parts connected in series and composed of two inverters and a capacitor each. They generate a plurality of delay signals D1 through Dm-1 from an input signal IN. While the unit delay parts may afford the same delay time, those having ordinary knowledge in the art may appreciate that the delay time of each unit delay part may be controlled in a variety of ways by regulating the sizes of the inverters and the capacitor.

The input signal IN and the plurality of delay signals D1 to Dm8-1 are inputted to the select section 12. The select section 12 includes a plurality of pass gates which are controlled by the test mode signals TM<1:m> and inverted signals TMB<1:m> of the test mode signals TM<1:m>. Therefore, the select section 12 is configured in a manner such that, when a specified test mode signal among the test mode signals TM<1:m> is enabled, a delayed signal obtained by delaying the input signal by a desired time may be outputted.

Each of the calibration units 10 and 30 may be provided by the number of input signals IN, or, the read control signals. For example, when the read control signals include the column selection signal YI, the output strobe signal IOSTB and the pipe latch control signal PIN and the circuit configuration shown in FIG. 3 is provided by the number of 3, it is possible to receive the three signals and generate the calibrated column selection signal YI_c, the calibrated output strobe signal IOSTB_c and the calibrated pipe latch control signal PIN_c.

Figure 4:
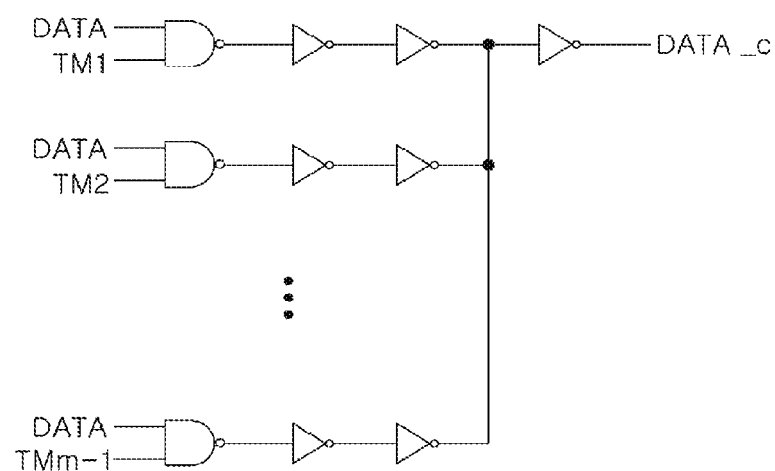
FIG. 4 is a circuit diagram illustrating another exemplary aspect of data calibration units shown in FIGS. 1 and 2.

FIG. 4 is a circuit diagram illustrating an exemplary aspect of data calibration units shown in FIGS. 1 and 2. Referring to FIG. 4, each of the data calibration units 20 and 40 includes a plurality of NAND gates which receive the data DATA and the test mode signals TM<1:m> and a plurality of inverters which invert the outputs of the NAND gates. Therefore, when a specified test mode signal among the test mode signal TM<1:m> is enabled, delayed data is outputted through the NAND gate which receives the enabled test mode signal and the inverters which are connected to the NAND gate. The delay amounts of the data DATA may be changed by regulating the sizes of the NAND gates and the inverters. Accordingly, it may be appreciated that delayed data delayed by a desired time may be outputted by enabling a certain test mode signal.

While certain embodiments have been described above with reference to illustrative embodiments for particular applications, it should be understood that the embodiments described are by way of example only. Those skilled in the art with access to the teachings provided in this disclosure will recognize additional modifications, applications, and/or embodiments and additional fields in which the present disclosure would be of significant utility. Accordingly, the disclosed semiconductor apparatus described herein should not be limited to the described embodiments. Rather, they should only be limited in light of the claims that follow when taken in conjunction with the above description and accompanying drawings.

What is claimed is:

1. A semiconductor apparatus having first and second chips stacked therein, comprising: a first calibration unit provided in the first chip and configured to delay and output read control signals of the first chip; a first data calibration unit provided in the first chip and configured to delay and output data outputted from the first chip; a second calibration unit provided in the second chip and configured to delay and output read control signals of the second chip; and a second data calibration unit provided in the second chip and configured to delay and output data outputted from the second chip.

2. The semiconductor apparatus according to claim 1, wherein the read control signals of the first chip include a column selection signal, an output strobe signal, and a pipe latch control signal.

3. The semiconductor apparatus according to claim 1, wherein the first calibration unit changes delay amounts of the read control signals of the first chip in response to a test mode signal.

4. The semiconductor apparatus according to claim 1, wherein the read control signals of the second chip include a column selection signal, an output strobe signal, and a pipe latch control signal.

5. The semiconductor apparatus according to claim 1, wherein the second calibration unit changes delay amounts of the read control signals of the second chip in response to a test mode signal.

6. The semiconductor apparatus according to claim 1, wherein the first data calibration unit changes a delay amount of the data outputted from the first chip in response to a test mode signal.

7. The semiconductor apparatus according to claim 1, wherein the second data calibration unit changes a delay amount of the data outputted from the second chip in response to a test mode signal.

8. A semiconductor apparatus having a master chip and a slave chip stacked therein, comprising: a first calibration unit provided in the master chip and configured to receive a pipe latch control signal and delay and output the pipe latch control signal; and a second calibration unit provided in the slave chip and configured to receive a column selection signal and an output strobe signal and delay and output the column selection signal and the output strobe signal.

9. The semiconductor apparatus according to claim 8, wherein the first calibration unit changes a delay amount of the pipe latch control signal in response to a test mode signal.

10. The semiconductor apparatus according to claim 8, wherein the second calibration unit changes delay amounts of the column selection signal and the output strobe signal in response to a test mode signal.

11. The semiconductor apparatus according to claim 8, further comprising: a data calibration unit provided in the slave chip and configured to delay and output data outputted from the slave chip.

12. The semiconductor apparatus according to claim 11, wherein the data calibration unit changes a delay amount of the data outputted from the slave chip in response to a test mode signal.

* * * * *